United States Patent
Bhatia et al.

(10) Patent No.: US 6,714,464 B2
(45) Date of Patent: Mar. 30, 2004

(54) SYSTEM AND METHOD FOR A SELF-CALIBRATING SENSE-AMPLIFIER STROBE

(75) Inventors: Ajay Bhatia, Fort Lee, NJ (US); Michael C. Braganza, Boston, MA (US); Shannon V. Morton, Brookline, MA (US); Shashank Shastry, Cambridge, MA (US)

(73) Assignee: Silicon Graphics, Inc., Mountain View, CA (US)

( * ) Notice: Subject to any disclaimer, the term of this patent is extended or adjusted under 35 U.S.C. 154(b) by 17 days.

(21) Appl. No.: 10/180,478

(22) Filed: Jun. 26, 2002

(65) Prior Publication Data

US 2004/0001364 A1 Jan. 1, 2004

(51) Int. Cl.[7] .............. G11C 7/00; G11C 7/02; G11C 8/00
(52) U.S. Cl. ............ 365/194; 365/189.07; 365/189.12; 365/193; 365/207; 365/233; 365/240
(58) Field of Search .......................... 365/194, 189.07, 365/189.12, 193, 207, 233, 240

(56) References Cited

U.S. PATENT DOCUMENTS

| | | | | |
|---|---|---|---|---|
| 4,722,074 A | * | 1/1988 | Fujishima et al. | 365/203 |
| 5,544,115 A | * | 8/1996 | Ikeda | 365/207 |
| 5,936,905 A | * | 8/1999 | Proebsting | 365/208 |
| 6,026,335 A | * | 2/2000 | Atlas | 257/314 |
| 6,028,335 A | * | 2/2000 | Okamoto et al. | |
| 6,219,282 B1 | * | 4/2001 | Tanaka | 365/185.33 |
| 6,400,623 B2 | * | 6/2002 | Ohno | 365/201 |
| 2001/0022738 A1 | * | 9/2001 | Choi | 365/63 |
| 2002/0033723 A1 | * | 3/2002 | Lee et al. | 327/201 |
| 2003/0107920 A1 | * | 6/2003 | Roohparvar | 365/185.22 |

* cited by examiner

Primary Examiner—David Nelms
Assistant Examiner—Ly Duy Pham
(74) Attorney, Agent, or Firm—Schwegman, Lundberg, Woessner & Kluth, P.A.

(57) ABSTRACT

A system and method for self-calibration of the strobe timing of the sense-amplifiers of a RAM array. In one method example, the timing of two sense amplifiers used to read the bit-lines of the RAM array is controlled by a Delay Locked Loop circuit (DLL). The timing of a first sense-amplifier strobe is reduced until the sense amplifier fails. The second sense amplifier has adequate timing margin however and is used to actually read the RAM bit-lines. Once the RAM read fails with the first sense amplifier, the DLL lengthens the strobe timing. Once the minimum threshold is set, the second sense amplifier will always read the correct data because of a built-in timing margin between the first and second amplifier. Thus the system constantly optimizes the RAM array read timing with each read cycle even though the minimal time varies.

9 Claims, 4 Drawing Sheets

SYSTEM AND METHOD FOR A SELF-CALIBRATING SENSE-AMPLIFIER STROBE

BACKGROUND

This document relates to memory technology, and, in particular, to a system and method for calibrating sense amplifier enable, or strobe, signals.

In computer memory systems it is important to minimize the time necessary to read data from RAM. When using a RAM array with self-contained read amplifier strobe timing, current methods use a conservative timing estimate obtained from circuit simulation. Since it is a conservative estimate, the timing is slower than what ideally could be used. Another method is to measure the RAM performance and set the timing once using fuses. Such an approach addresses process variations, but once the timing is set, the RAM array does not have the ability to dynamically alter its timing as needed to respond to variations in voltage, temperature or noise. Therefore the strobe tiring must be set conservatively to account for changes in voltage, temperature and noise. What is needed is a system and method for setting strobe timing that reduces the memory cycle as much as possible while adapting to changes in process, voltage, temperature and noise.

SUMMARY

This document discusses a system and method for self-calibration of the strobe timing of the sense-amplifiers of a RAM array. In one method example, the timing of two sense amplifiers used to read the bit-lines of the RAM array is controlled by a Delay Locked Loop circuit (DLL). The timing of a first sense-amplifier strobe is reduced until the sense amplifier fails. The second sense amplifier has adequate timing margin however and is used to actually read the RAM bit-lines. Once the RAM read fails with the first sense amplifier, the DLL lengthens the strobe timing. Once the minimum threshold is set, the second sense amplifier will always read the correct data because of a built-in timing margin between the first and second amplifier. Thus the system constantly optimizes the RAM array read timing with each read cycle even though the minimal time varies.

BRIEF DESCRIPTION OF THE DRAWINGS

In the drawings, where like numerals refer to like components throughout the several views.

DETAILED DESCRIPTION

In the following detailed description, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
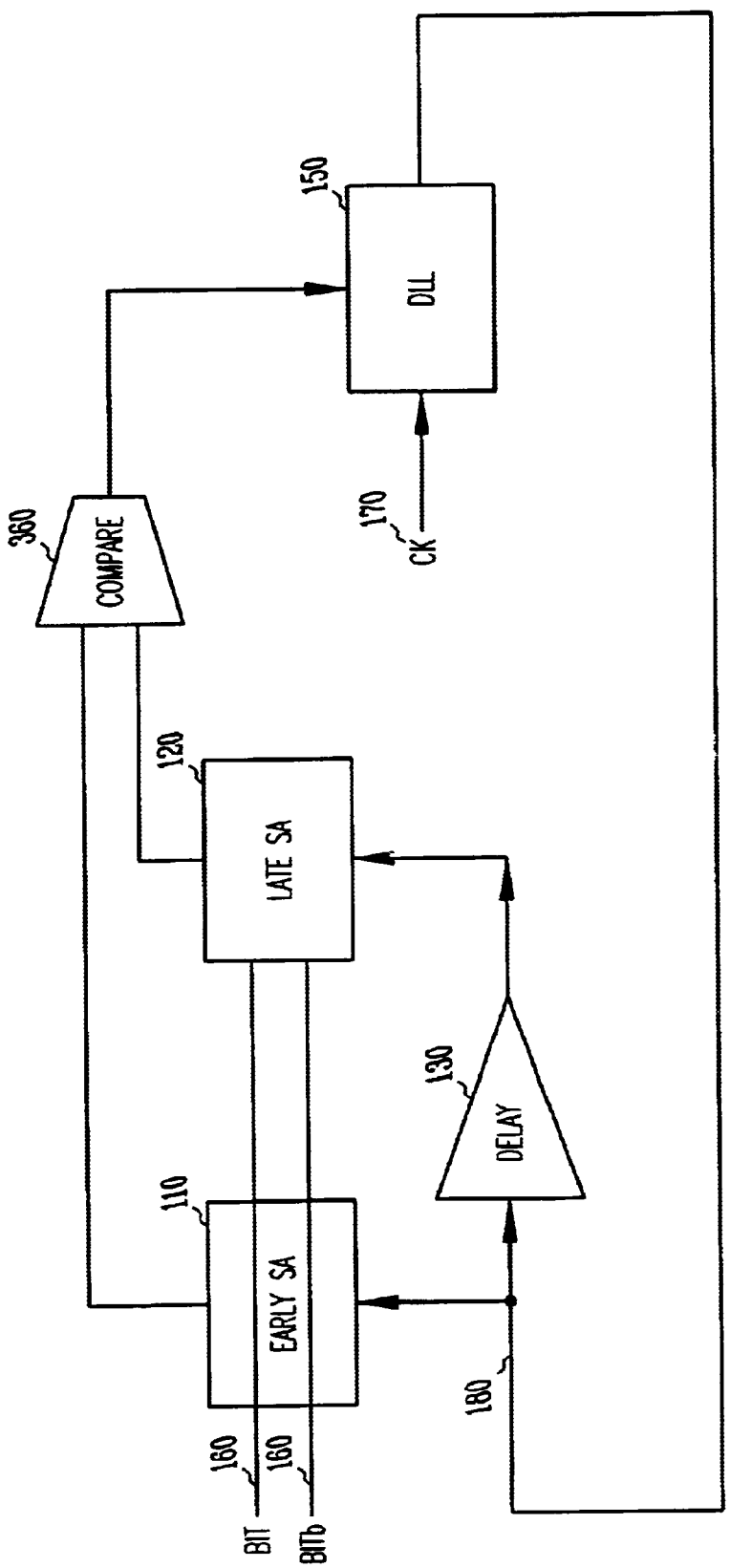
FIG. 1 shows a block diagram of the components of the self-calibrating sense amplifier strobe circuit.

FIG. 1 shows two sense amplifiers 110 and 120 used to read data from RAM bit lines 160. Delay circuit 130 creates a fixed timing margin between the first sense amplifier 110 and the second sense amplifier 120 such that the first sense amplifier 110 is strobed earlier than the second sense amplifier 120. A comparison circuit, or comparator, 360 compares the values of data read by sense amplifiers 110 and 120. A Delay Locked Loop (DLL) circuit 150 adjusts the timing of the first sense amplifier strobe signal 180 earlier or later with respect to a reference clock signal 170 depending on the output of the amplifiers 110 and 120. In one embodiment, if a glitch is not detected by the comparison circuit 360 at the output of the early amplifier 110 or the outputs of the two amplifiers 110 and 120 match, the DLL 150 decreases the time interval between the reference clock signal 170 and the first sense amplifier strobe signal 180. In the present example a glitch would occur when differential sense amplifier 110 is strobed too close to the transition of bit-lines 160. This prevents the sense amplifier 110 from resolving the differential bit-line signal causing it to enter a meta-stable state.

If a glitch is detected by the comparison circuit 360 at the output of the early amplifier 110 or the outputs of the two amplifiers 110 and 120 do not match, the read has failed. The DLL 150 then increases the time interval between the reference clock signal 170 and the first sense amplifier strobe signal 180. Once the read fails, the minimum strobe delay has been found. Even though the read fails, the late sense amplifier 120 reads the correct data because of the timing margin 130 added between the sense amplifiers 110 and 120. In one embodiment, delay 130 is formed by connecting two logic inverters in series.

Figure 2:
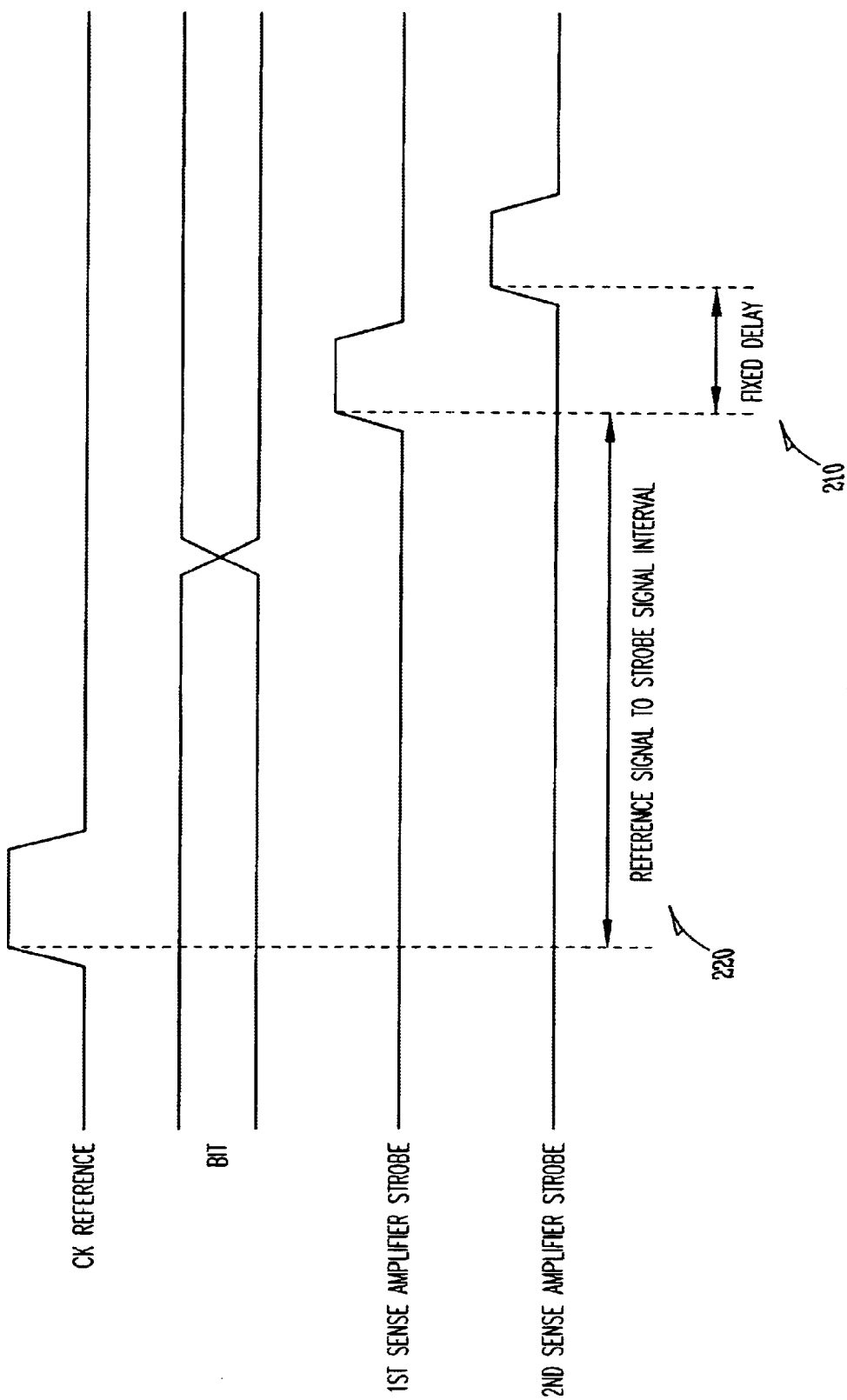
FIG. 2 shows the relationship of the timing signals.

FIG. 2 is a timing diagram showing the relationship of the signals. The timing of the strobe of the first sense amplifier 110 is earlier than the strobe of the second amplifier 120 by a fixed delay 210 or timing margin. The DLL 150 shortens or lengthens the interval 220 from a reference clock signal to the strobe of the first sense amplifier 110. As the time of the first sense amplifier strobe signal approaches the Bit signal transition time, the output of the first sense amplifier will either glitch or will not match the output of the second sense amplifier and the read will fail. The fixed delay 210 must be long enough to guarantee that the data can be read reliably by the second sense amplifier when the read of the first sense amplifier fails.

Figure 3:
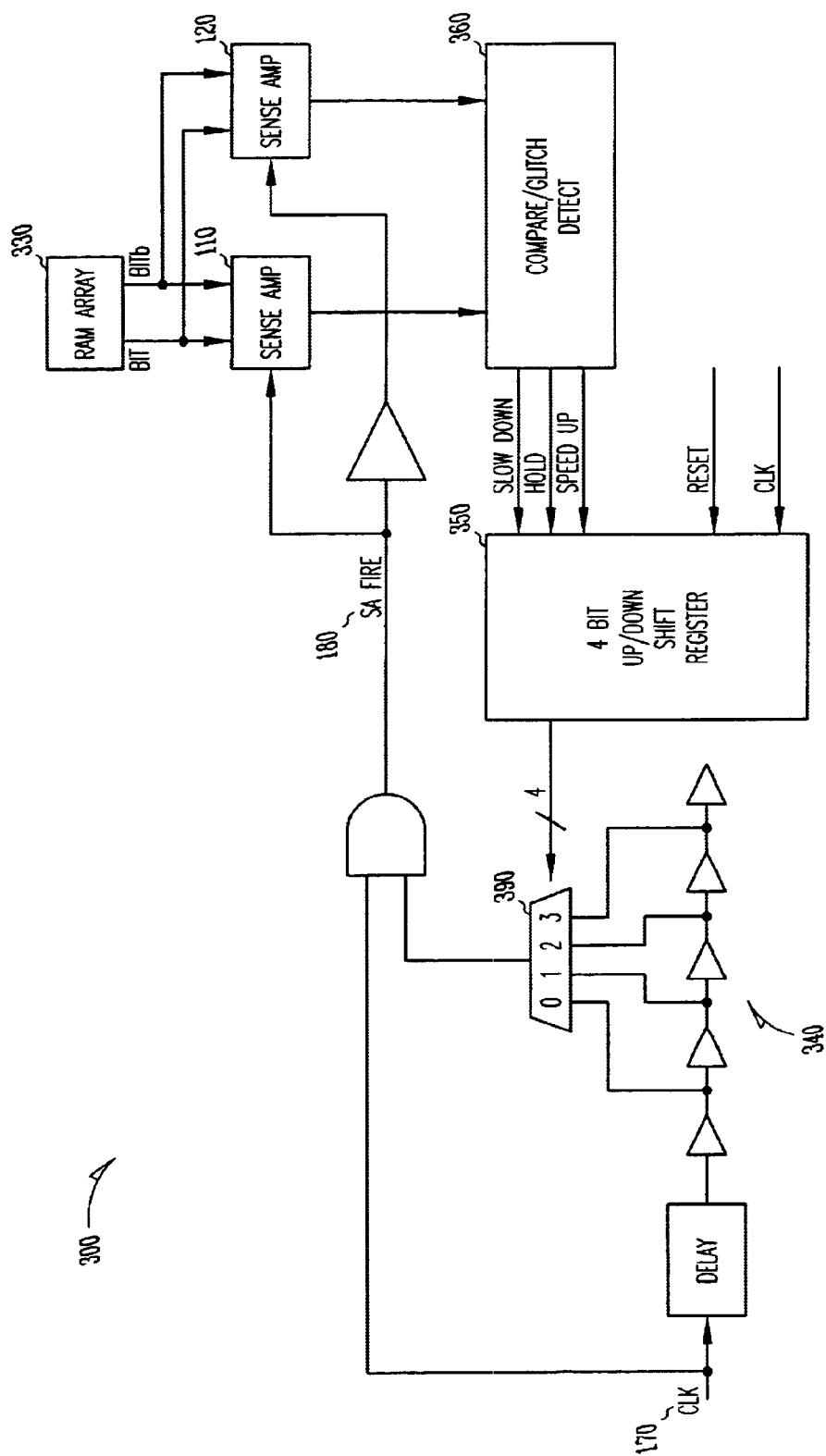
FIG. 3 shows a system level block diagram with a detailed illustration of the DLL.

FIG. 3 shows one embodiment of a memory device 300 according to the present invention. In memory device 300, comparison circuit 360 monitors the data read from RAM array 330 by early sense amplifier 110 and late sense amplifier 120 and either slows down, holds, or speeds up the time interval between the reference clock signal 170 and the first sense amplifiers strobe signal 180. In this embodiment, output lines slowdown, hold, and speed up are used to increase, hold, or decrease the count of an up/down shift register 350. In this example the shift register is comprised of 4 bits. The up/down shift register 350 uses multiplexer 390 to select one of four timing settings for the clock reference to first sense amplifier strobe signal timing interval. In one embodiment, the timing settings are implemented with a delay line 340 consisting of unit-delay circuits. By way of example, but not limitation, the unit-delay circuits can be realized as two unit gate delays from two logic inverters. This allows adjustment of the timing interval by increments of 50 to 60 picoseconds.

In this example, up/down shift register 350 is initially set to select the longest time interval. The output of the early sense amplifier 110 is glitch-free and the data read by the sense amplifiers 110 and 120 matches. The up/down shift register 350 gradually decreases the time interval each read cycle until the output of the early sense amplifier 110 glitches or the output of the early sense amplifier 110 does not match the output of the late sense amplifier 120 and the read fails. The output of the late sense amplifier 120 is then used to determine the data.

If the column is not selected during the RAM read cycle, the early sense amplifier is not enabled and the shift register output is held constant.

If the read fails, the up/down shift register 350 increases the time interval for the next read cycle and subsequent read cycles until the output of the early sense amplifier 110 is glitch-free and the data read by the sense amplifiers 110 and 120 matches. At this point up/down shift register 350 again begins to decrease the time interval. Thus in this example, memory device 300 regulates itself to approach a minimal strobe delay. Adjustment is continual and dynamic.

In another embodiment, the comparison circuit 360 operates to sample the outputs of sense amplifiers 110 and 120 at predetermined intervals. In such an embodiment, the strobe delay is adjusted only at these predetermined intervals.

In another example, a 2-bit counter is used instead of 4-bit up/down shift register 350 to select one of four timing settings. The amount of timing settings can easily be changed by increasing or decreasing the size of the counter or shift register. By way of example, but not of limitation, an 8 bit up/down shift register or a 3 bit counter could be used to select one of eight timing settings.

Figure 4:
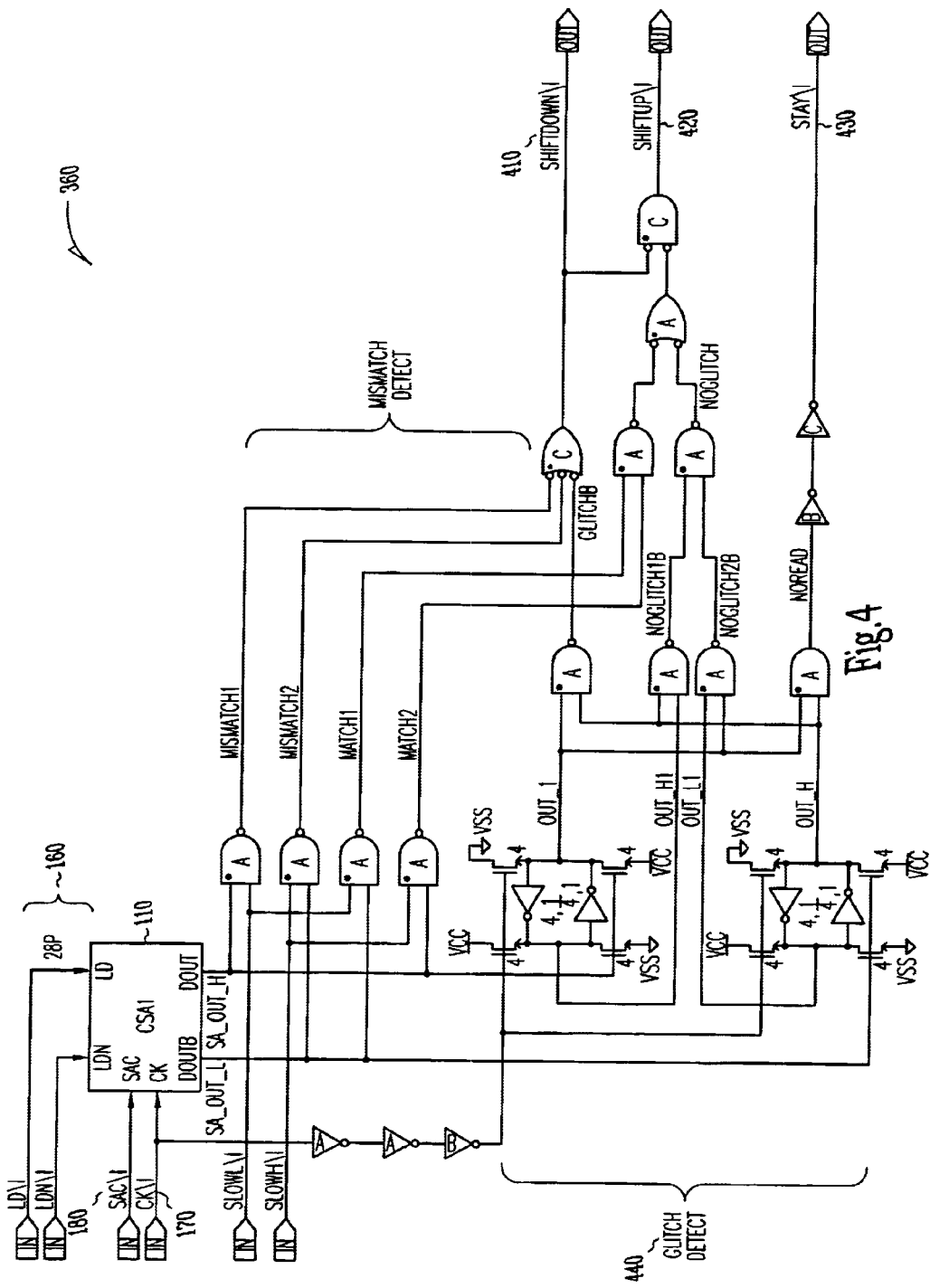
FIG. 4 shows one embodiment of a glitch detection circuit.

FIG. 4 shows one embodiment of a comparison circuit 360 which could be used in the memory device 300 of FIG. 3. In the embodiment shown, bit lines 160 are coupled to the differential early sense amplifier 110. The outputs of the early sense amplifier 110 are coupled to the inputs of the glitch detection circuit 440. As the time of the early sense amplifier strobe signal 180 approaches the bit signal 160 transition time, the outputs of the early sense amplifier will both begin to transition high instead of manifesting a differential output. This results in a glitch, or runt pulse, at the output of the sense amplifier. When a glitch occurs the shiftdown signal 410 goes active, lengthening the timing interval of the clock reference 170 signal relative to the early sense amplifier strobe 180.

Similarly, as the two sense amplifier outputs match and no glitches are detected, the shiftup signal 420 goes active, shortening the time interval of the clock reference 170 signal relative to the early sense amplifier strobe 180. Finally, if the bit lines 160 are not selected the two sense amplifier outputs are inactive and the stay signal 430 goes active, maintaining the same timing interval of the clock reference 170 signal relative to the early sense amplifier strobe 180 as the previous RAM read cycle.

Although specific examples have been illustrated and described herein, it will be appreciated by those of ordinary skill in the art that any arrangement which is calculated to achieve the same purpose may be substituted for the specific example shown. This application is intended to cover any adaptations or variations of the present invention. Therefore, it is intended that this invention be limited only by the claims and the equivalents thereof.

What is claimed is:

1. A sense amplifier strobe system, comprising:
   a first and a second sense amplifier coupled to the bit lines of a memory device wherein each sense amplifier includes a strobe input and a data output;
   a comparison circuit coupled to the data output of the first and second sense amplifier, wherein the comparison circuit compares the data on the data output of the second sense amplifier to data on the data output of the first sense amplifier; and
   a delay-locked-loop (DLL) circuit coupled to the output of the comparison circuit and to the strobe input of the first sense amplifier, wherein the delay-locked-loop circuit adjusts the timing of the first sense amplifier strobe signal with respect to a reference clock signal if the data on the data output of the first sense amplifier is different than the data on the data output of the second sense amplifier.

2. The system of claim 1, wherein the memory device is a RAM array.

3. The system of claim 1, wherein the comparison circuit includes:
   a glitch detection circuit coupled to the output of the first and second sense amplifiers, wherein the glitch detection circuit includes a first, a second, and a third glitch detection output.

4. The system of claim 3, wherein the glitch detection via the output of the up/down shift register and the multiplexer output adjusts the timing of the sense amplifier strobes.

5. The system of claim 1, wherein the DLL includes:
   an up/down shift register comprising a shift register output and a first, second, and third shift register input coupled to the outputs of the glitch detection circuit;
   a delay timing chain comprising a cascade of delays including a delay timing chain input and a delay timing chain output wherein the timing chain input is clocked by a reference clock signal; and
   a multiplexer coupled to the shift register output and the delay timing chain output.

6. The system of claim 1, further including a glitch detection circuit having a first glitch detection output, wherein the first glitch detection output is configured to adjust the timing of the sense amplifier strobes later with respect to the reference clock signal when the first sense amplifier output is a glitch or the second sense amplifier sensed different data than the first sense amplifier.

7. The system of claim 1, further including a glitch detection circuit having a second glitch detection output, wherein the second glitch detection output is configured to adjust the timing of the sense amplifier strobes earlier with respect to the reference clock signal when the first sense amplifier output does not glitch and the second sense amplifier sensed the same data as the first sense amplifier.

8. The system of claim 1, further including a glitch detection circuit having a third glitch detection output, wherein the third glitch detection output is configured to hold the timing of the sense amplifier strobes with respect to the reference clock signal when the bit lines of the RAM array are not selected during a RAM read cycle.

9. In a memory device having a first and second sense amplifier, wherein each sense amplifier includes an output, a method of dynamically adjusting the sense amplifier strobe signals, the method comprising:
   driving the first sense amplifier with a first sense amplifier strobe;
   delaying the first sense amplifier strobe;
   driving the second sense amplifier with the delayed first sense amplifier strobe;
   comparing the output of each sense amplifier; and
   if the outputs do not match, adjusting a timing of the first sense amplifier strobe in relation to a referenced clock.

* * * * *

UNITED STATES PATENT AND TRADEMARK OFFICE
CERTIFICATE OF CORRECTION

PATENT NO. : 6,714,464 B2
DATED : March 30, 2004
INVENTOR(S) : Bhatia et al.

It is certified that error appears in the above-identified patent and that said Letters Patent is hereby corrected as shown below:

Title page,
Item [56], References Cited, U.S. PATENT DOCUMENTS, after "et al." insert
-- 257/314 --.

Signed and Sealed this

Thirtieth Day of November, 2004

JON W. DUDAS
*Director of the United States Patent and Trademark Office*